(12) United States Patent
Yoshimura

(10) Patent No.: US 8,878,076 B2
(45) Date of Patent: Nov. 4, 2014

(54) WIRING SUBSTRATE AND MANUFACTURING METHOD FOR WIRING SUBSTRATE

(71) Applicant: Fujitsu Limited, Kawasaki (JP)

(72) Inventor: Hideaki Yoshimura, Suzaka (JP)

(73) Assignee: Fujitsu Limited, Kawasaki (JP)

( * ) Notice: Subject to any disclaimer, the term of this patent is extended or adjusted under 35 U.S.C. 154(b) by 92 days.

(21) Appl. No.: 13/629,660

(22) Filed: Sep. 28, 2012

(65) Prior Publication Data

US 2013/0098669 A1   Apr. 25, 2013

(30) Foreign Application Priority Data

Oct. 21, 2011   (JP) ................................ 2011-231684

(51) Int. Cl.
| | |
|---|---|
| *H05K 1/03* | (2006.01) |
| *H05K 3/42* | (2006.01) |
| *H05K 3/44* | (2006.01) |
| *H05K 1/02* | (2006.01) |

(52) U.S. Cl.
CPC ............ *H05K 1/0353* (2013.01); *H05K 1/0271* (2013.01); *H05K 3/427* (2013.01); *H05K 3/445* (2013.01); *H05K 2201/068* (2013.01); *H05K 2201/0323* (2013.01); *H05K 2201/0959* (2013.01)
USPC ............................ 174/262; 174/256; 174/258

(58) Field of Classification Search
CPC ... H05K 1/0206; H05K 1/115; H05K 1/0353; H05K 3/4608; H05K 3/429; H05K 3/0094; H05K 3/4038; H05K 3/42; H05K 2201/0281; H05K 2201/0959; H05K 2201/0323; H05K 2201/09536; H05K 2201/427

USPC .................. 174/262, 264–266, 256–258
See application file for complete search history.

(56) References Cited

U.S. PATENT DOCUMENTS

| | | | | |
|---|---|---|---|---|
| 6,869,665 | B2 * | 3/2005 | Tani et al. ...................... | 428/209 |
| 7,002,080 | B2 * | 2/2006 | Tani et al. ...................... | 174/258 |
| 7,038,142 | B2 * | 5/2006 | Abe ................................ | 174/255 |
| 2004/0163248 | A1 * | 8/2004 | Lu et al. .......................... | 29/852 |
| 2008/0011507 | A1 * | 1/2008 | Vasoya ........................... | 174/260 |
| 2009/0095509 | A1 | 4/2009 | Hirano et al. | |
| 2009/0294166 | A1 | 12/2009 | Yoshimura et al. | |

FOREIGN PATENT DOCUMENTS

| | | |
|---|---|---|
| JP | 2009099619 | 5/2009 |
| JP | 2009290124 | 12/2009 |
| JP | 2009544153 | 12/2009 |

\* cited by examiner

*Primary Examiner* — Hoa C Nguyen
*Assistant Examiner* — Amol Patel
(74) *Attorney, Agent, or Firm* — Squire Patton Boggs (US) LLP

(57) ABSTRACT

A wiring substrate includes: a plate-like base material containing carbon fibers; a wiring layer formed on a surface of the base material; a first via including a first through hole penetrating through the base material, a first resin layer formed on an inner wall of the first through hole and including a second through hole, and a first conductive layer formed on an inner wall of the second through hole; and a second via including a third through hole penetrating through the base material and a second conductive layer formed on an inner wall of the third through hole, wherein an inside diameter of the third through hole is greater than an inside diameter of the second through hole.

5 Claims, 14 Drawing Sheets

FIG. 6
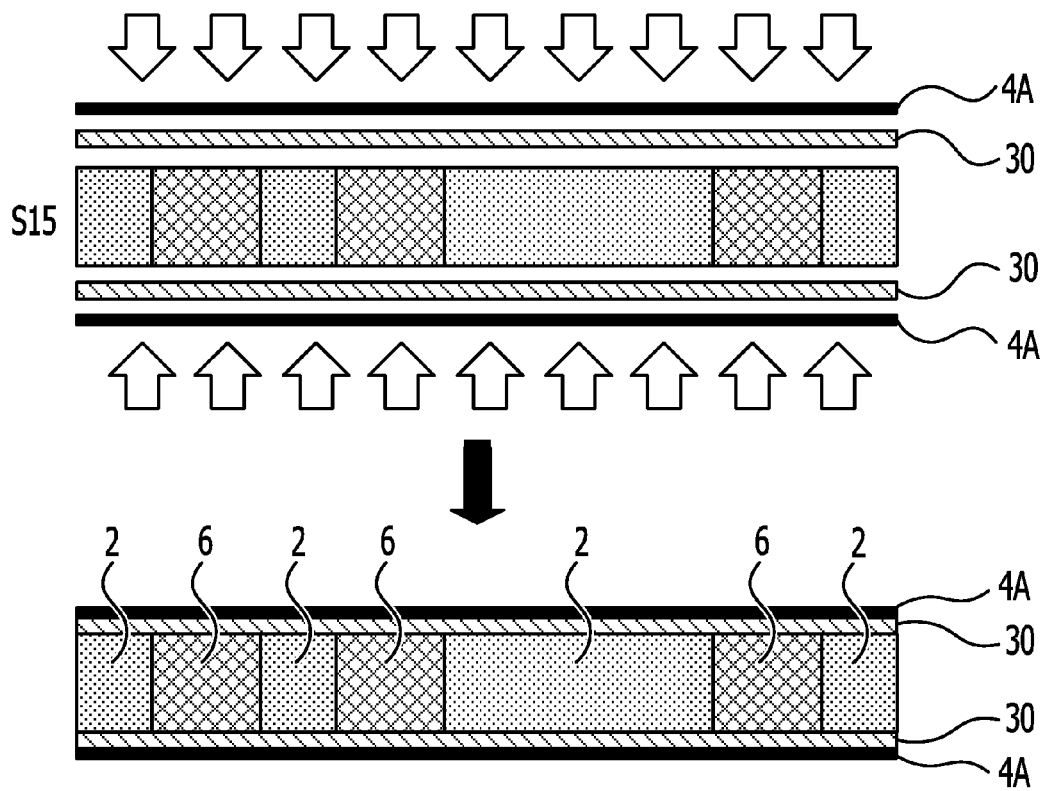
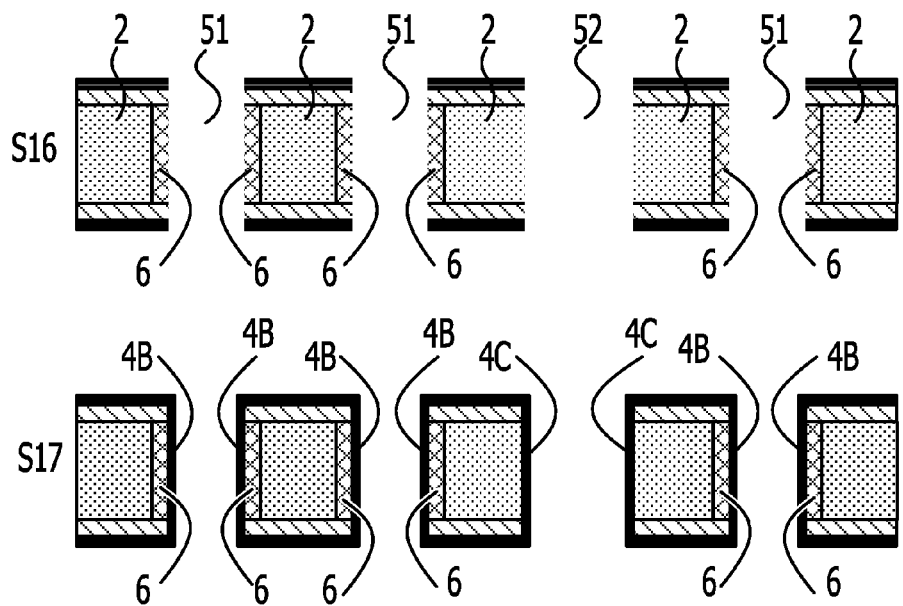

FIG. 10A

| MATERIAL | PHYSICAL PROPERTY VALUE | |
|---|---|---|
| | ELASTICITY MODULUS (GPa) | THERMAL EXPANSION COEFFICIENT (ppm/°C) |
| CARBON COMPOSITE MATERIAL | 80 | 1.0 |
| COPPER WIRING | 100 | 17.2 |
| THROUGH HOLE PLATING | 100 | 17.2 |
| INSULATING LAYER | 27 | 14.0 |
| HOLE-FILLING MATERIAL | 4.7 | 33.0 |

FIG. 10B

| | |
|---|---|
| a: THICKNESS OF WIRING PATTERN | 0.035mm |
| b: THICKNESS OF WIRING LAYER | 0.1mm |
| c: THICKNESS OF CARBON BASE MATERIAL | 1.0mm |
| m: THICKNESS OF CONDUCTIVE PORTION IN THROUGH HOLE | 0.025mm |
| Φd: INSIDE DIAMETER OF THROUGH HOLE VIA FOR SIGNAL | 0.2mm |
| ΦD: INSIDE DIAMETER OF THROUGH HOLE VIA FOR POWER SOURCE | 0.7mm |

FIG. 10C

| ANALYTICAL MODEL | PHYSICAL PROPERTY VALUE | DOUBLE-STRUCTURE THROUGH HOLE VIA | SINGLE-STRUCTURE THROUGH HOLE VI |
|---|---|---|---|
| 100 | THERMAL EXPANSION COEFFICIENT (ppm/°C) | 4.4 | 3.2 |
| | ELASTICITY MODULUS (GPa) | 44.5 | 68.4 |
| 1A | THERMAL EXPANSION COEFFICIENT (ppm/°C) | 4.4 | 3.5 |
| | ELASTICITY MODULUS (GPa) | 44.5 | 43.5 |
| 1B | THERMAL EXPANSION COEFFICIENT (ppm/°C) | 5.1 | 5.3 |
| | ELASTICITY MODULUS (GPa) | 48.1 | 47.2 |
| 1C | THERMAL EXPANSION COEFFICIENT (ppm/°C) | 4.4 | 4.6 |
| | ELASTICITY MODULUS (GPa) | 44.5 | 45.0 |

FIG. 13A
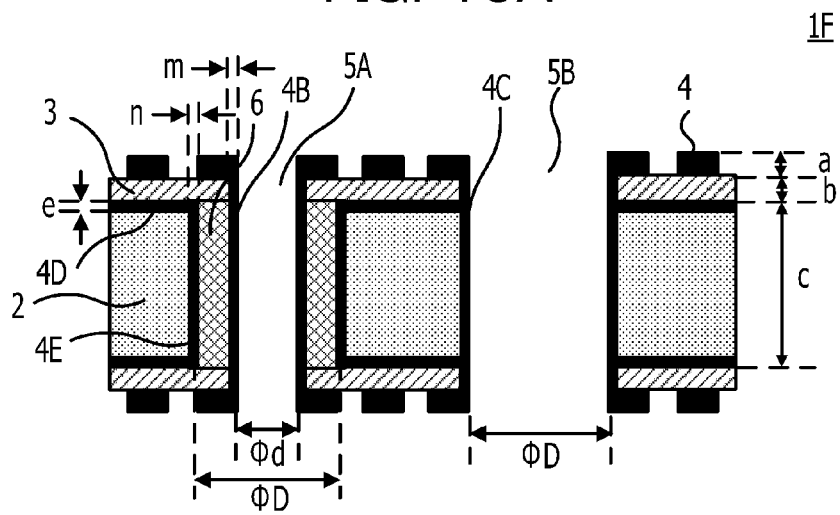
FIG. 13B
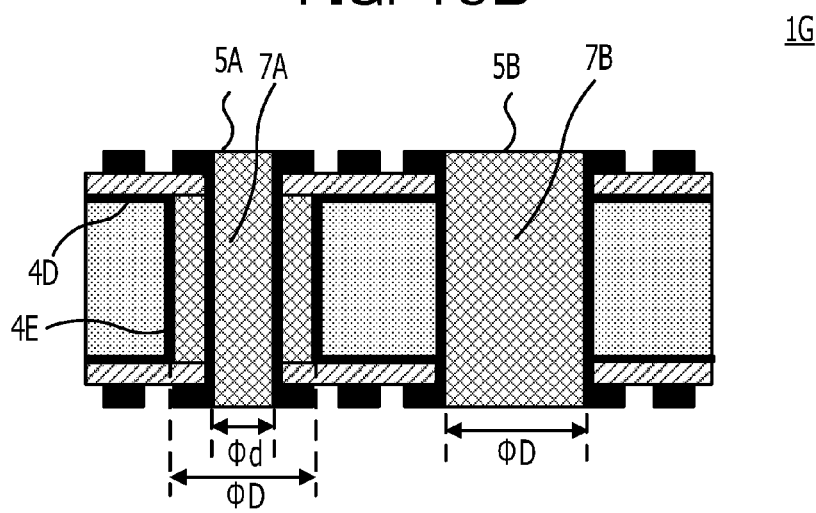
FIG. 13C
| ANALYTICAL MODEL | PHYSICAL PROPERTY VALUE | DOUBLE-STRUCTURE THROUGH HOLE VIA | SINGLE-STRUCTURE THROUGH HOLE VI |
|---|---|---|---|
| 1F | THERMAL EXPANSION COEFFICIENT (ppm/°C) | 5.6 | 4.1 |
| | ELASTICITY MODULUS (GPa) | 48.6 | 43.8 |
| 1G | THERMAL EXPANSION COEFFICIENT (ppm/°C) | 6.1 | 5.9 |
| | ELASTICITY MODULUS (GPa) | 51.9 | 47.4 |

WIRING SUBSTRATE AND MANUFACTURING METHOD FOR WIRING SUBSTRATE

CROSS-REFERENCE TO RELATED APPLICATION

This application is based upon and claims the benefit of priority of the prior Japanese Patent Application No. 2011-231684, filed on Oct. 21, 2011, the entire contents of which are incorporated herein by reference.

FIELD

The embodiments discussed herein are related to a wiring substrate and a manufacturing method for the same.

BACKGROUND

Common wiring substrates have a thermal expansion coefficient substantially matching that of copper wiring. While high heat-resistance wiring substrates according to FR4 (flame retardant: a symbol indicating the grade of flame resistance of a copper-clad laminate board serving as a member of a wiring substrate) have been commercialized in recent years, the wiring substrates generally have a thermal expansion coefficient of 15 ppm/° C. or more.

LSI (large scale integration) elements formed on a silicon wafer have a thermal expansion coefficient of 3 to 3.5 ppm/° C. Therefore, it is desirable that package substrates on which the LSI elements (bare chips) are directly mounted and wiring substrates for probe cards for testing the silicon wafer in a high-temperature or low-temperature circumstance have a thermal expansion coefficient matching that of the silicon wafer. In order to meet such desires, it is known to obtain a wiring substrate having a thermal expansion coefficient matching that of a silicon wafer by using a carbon base material obtained by impregnating carbon fibers having a low thermal expansion coefficient and a high elasticity modulus in a core portion of the wiring substrate, or by sandwiching a desired layer between carbon base materials.

FIG. 1 illustrates a typical cross-sectional structure of a wiring substrate (double-sided substrate) according to the related art in which a carbon base material is used. A wiring substrate 100 illustrated in FIG. 1 includes a base material 102 which is a carbon composite material, wiring layers 103 stacked on the front surface and the back surface of the base material 102, and wiring patterns 104 formed on the wiring layers 103. Further, two types of through hole vias 105A and 105B for electrical conduction between the upper and lower wiring layers 104 are formed to penetrate through the wiring layers 103 and the base material 102.

The through hole via 105B, which is illustrated on the right side of the drawing, is a single-structure through hole via for electrical conduction with the base material 102 which is conductive, and is used for connection with a power source. Meanwhile, the through hole via 105A, which is on the left side, is a double-structure through hole via surrounded by an insulating resin 106, and is electrically insulated from the base material 102. The double-structure through hole via 105A is used for connection with another power source separated from the power source for the base material 102, or for connection with a signal.

However, the carbon composite material is prepared by pressing a matrix resin having a high thermal expansion coefficient onto carbon fibers in the thickness direction, and therefore has a high thermal expansion coefficient in the thickness direction compared to that in the planar direction.

The following is reference document:
[Document 1] Japanese National Publication of International Patent Application No. 2009-544153

SUMMARY

According to an aspect of the invention, a wiring substrate includes: a plate-like base material containing carbon fibers; a wiring layer formed on a surface of the base material; a first via including a first through hole penetrating through the base material, a first resin layer formed on an inner wall of the first through hole and including a second through hole, and a first conductive layer formed on an inner wall of the second through hole; and a second via including a third through hole penetrating through the base material and a second conductive layer formed on an inner wall of the third through hole, wherein an inside diameter of the third through hole is greater than an inside diameter of the second through hole.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 illustrates the manufacturing process for the wiring substrate according to the second embodiment;

FIGS. 10A to 10C illustrate the analysis conditions and the results of analyzing the physical property values of the analytical models;

FIG. 13A is a cross-sectional view of a wiring substrate according to a sixth embodiment;

FIG. 13B is a cross-sectional view of a wiring substrate according to a seventh embodiment;

FIG. 13C illustrates the results of analyzing the physical property values of analytical models for the wiring substrates according to the sixth and seventh embodiments;

DESCRIPTION OF EMBODIMENTS

Figure 2:
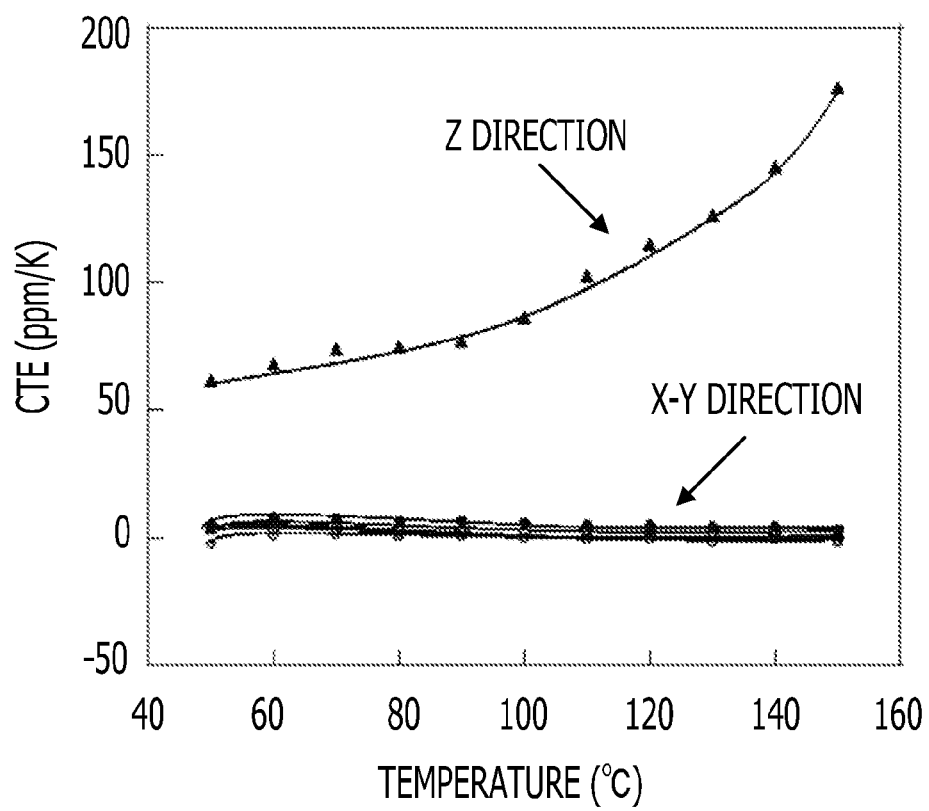
FIG. 2 illustrates the thermal expansion coefficient of a carbon base material.

FIG. 2 illustrates the thermal expansion coefficient of a carbon base material obtained by impregnating a typical plain-woven carbon cloth with an epoxy resin. The X-Y direction indicates the planar direction, and the Z direction indicates the thickness direction (with t representing the thickness of the carbon base material).

As seen from FIG. 2, the thermal expansion coefficient of the carbon base material in the X-Y (planar) direction is low enough to match that of a silicon wafer. It is also seen that the thermal expansion coefficient of the carbon base material is hardly varied in accordance with the temperature, and thus the carbon base material is suitable for use in substrates subjected to significant temperature variations, such as substrates for probe cards.

However, the thermal expansion coefficient of the carbon base material in the Z (thickness) direction may become 100 ppm/° C. or more, and may be too high for the thermal expansion coefficient, 17 ppm/° C., of copper, which is the material of the conductor of the through hole vias. This may cause a through hole crack (barrel crack) to impair the reliability of connection.

The through hole crack is caused when a stress due to a difference between the thermal expansion coefficient of copper serving as the material of the conductor and the thermal expansion coefficient of the base material in the thickness direction is applied to the through hole via. Because the stress is received by the cross section of the through hole via, a crack is more likely to occur as the diameter (cross section) of the through hole is smaller.

Returning to FIG. 1, the opening diameter of the double-structure through hole via 105A and the opening diameter of the single-structure through hole via 105B are equal to each other at $\phi d1$. In such a substrate, a stress applied to the double-structure through hole via 105A is distributed not only to the conductor in the via, but also to the surrounding insulating resin 106. However, a stress applied to the single-structure through hole via 105B concentrates only on the conductor in the via, which makes occurrence of a crack particularly likely.

A wiring substrate and a manufacturing method for a wiring substrate according to embodiments discussed herein will be described in detail below with reference to the drawings. The embodiments are not intended to limit the disclosed technology.

Figure 3:
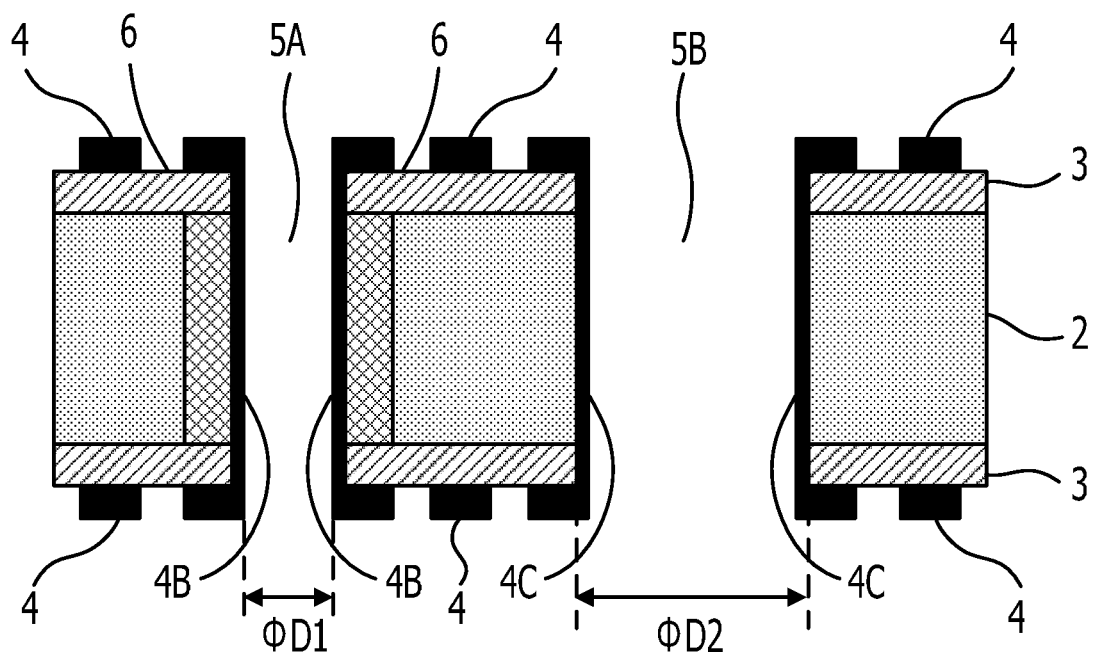
FIG. 3 is a cross-sectional view of a wiring substrate according to a first embodiment.

FIG. 3 is a cross-sectional view of a wiring substrate 1A according to a first embodiment. The wiring substrate 1A illustrated in FIG. 3 includes a base material 2, wiring layers 3 stacked on the front surface and the back surface of the base material 2, and wiring patterns 4 formed on the wiring layers 3. A carbon composite material is used as the base material 2. Further, two types of through hole vias 5A and 5B for electrical conduction between the upper and lower wiring layers 4 are formed to penetrate through the wiring layers 3 and the base material 2.

The through hole via 5B, which is illustrated on the right side of the drawing, is a single-structure through hole via for electrical conduction with the base material 2 which is conductive, and is used for connection with a power source. A cylindrical conductive layer 4C for electrical conduction between the upper and lower wiring patterns 4 is formed on the inner wall of the through hole of the single-structure through hole via 5B. The conductive layer 4C is made of a metal containing copper that is the same as the material of the wiring patterns 4.

Meanwhile, the through hole via 5A, which is on the left side of the drawing, is a double-structure through hole via surrounded by an insulating resin 6, and is electrically insulated from the base material 2. A cylindrical conductive layer 4B for electrical conduction between the upper and lower wiring patterns 4 is formed on the inner wall of the through hole of the double-structure through hole via 5A. The conductive layer 4B is made of a metal containing copper that is the same as the material of the wiring patterns 4. The outer periphery of the conductive layer 4B is covered by the surrounding insulating resin 6 so as to be electrically insulated from the base material 2. The double-structure through hole via 5A is used for connection with another power source separated from the power source for the base material 2, or for connection with a signal.

In the following description, the through hole via on the left side of the drawing is defined as a double-structure through hole via, and the through hole via on the right side of the drawing is defined as a single-structure through hole via.

In the embodiment, the diameter $\phi D2$ of the conductive layer 4C of the single-structure through hole via 5B is set to be greater than the diameter $\phi D1$ of the conductive layer 4B of the double-structure through hole via 5A ($\phi D2 > \phi D1$). With the conductive layer 4C for the single-structure through hole via 5B thus having a greater diameter $\phi D2$, the area of the conductive layer 4C with respect to the cross section is increased. In other words, an increase in volume of the copper material of the conductive layer 4C enhances the strength against a stress due to thermal expansion of the carbon composite material in the thickness direction, avoiding occurrence of a through hole crack.

Figure 1:
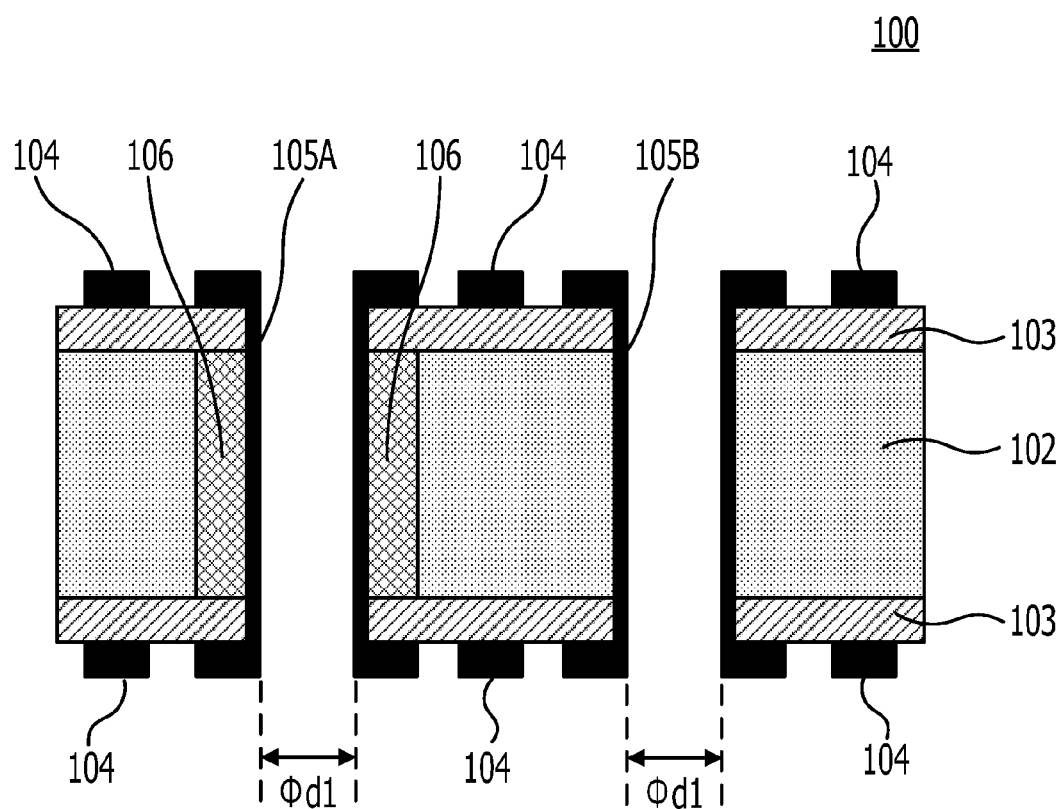
FIG. 1 is a cross-sectional view of a wiring substrate according to the related art in which a carbon base material is used.
Figure 4:
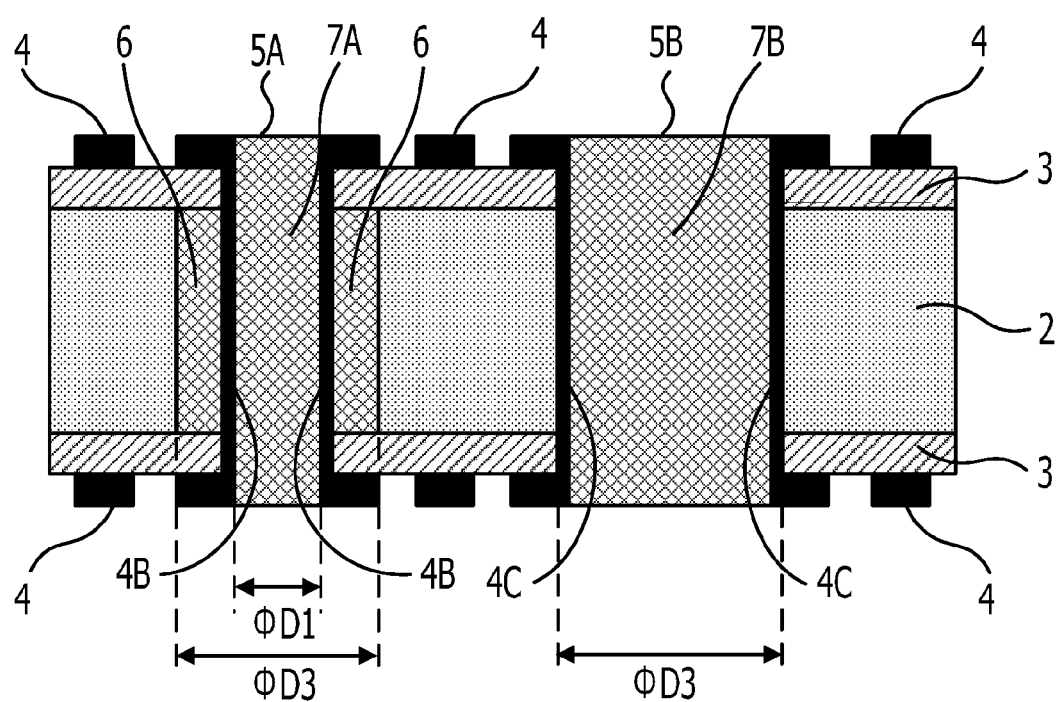
FIG. 4 is a cross-sectional view of a wiring substrate according to a second embodiment.

Next, a wiring substrate 1B according to a second embodiment will be described with reference to FIG. 4. FIG. 4 is a cross-sectional view of the wiring substrate 1B according to the second embodiment. Components in FIG. 4 that are the same as or equivalent to those of the wiring substrate 1A illustrated in FIG. 1 are denoted by the same reference symbols, and description thereof will be omitted.

In the wiring substrate 1B according to the second embodiment, in contrast to the wiring substrate 1A according to the first embodiment, the through holes of the through hole vias are filled with a resin. Further, the total amount of resin provided in the double-structure through hole via 5A is substantially the same as the amount of resin provided in the single-structure through hole via 5B.

With reference to FIG. 4, defining the outside diameter of the insulating resin 6 surrounding the conductive layer 4B of the double-structure through hole via 5A as $\phi D3$, the diameter $\phi D2$ of the conductive layer 4C of the single-structure through hole via 5B is set such that $\phi D2 = \phi D3$ is met. In the base material 2, the total of the cross-sectional area of a resin 7A provided in a space inside the conductive layer 4B of the double-structure through hole via 5A and the cross-sectional area of the resin 6 surrounding the conductive layer 4B is set to be equal to the cross-sectional area of a resin 7B provided in a space inside the conductive layer 4C of the single-structure through hole via 5B. That is, in the base material 2, the volume of the resin in the double-structure through hole via 5A is substantially equal to the volume of the resin in the single-structure through hole via 5B. Hence, a stress does not concentrate on one of the through hole vias, avoiding occurrence of a through hole crack which is occasionally caused in the wiring substrate according to the related art. The effect of the embodiment will be discussed later using specific values.

Figure 5:
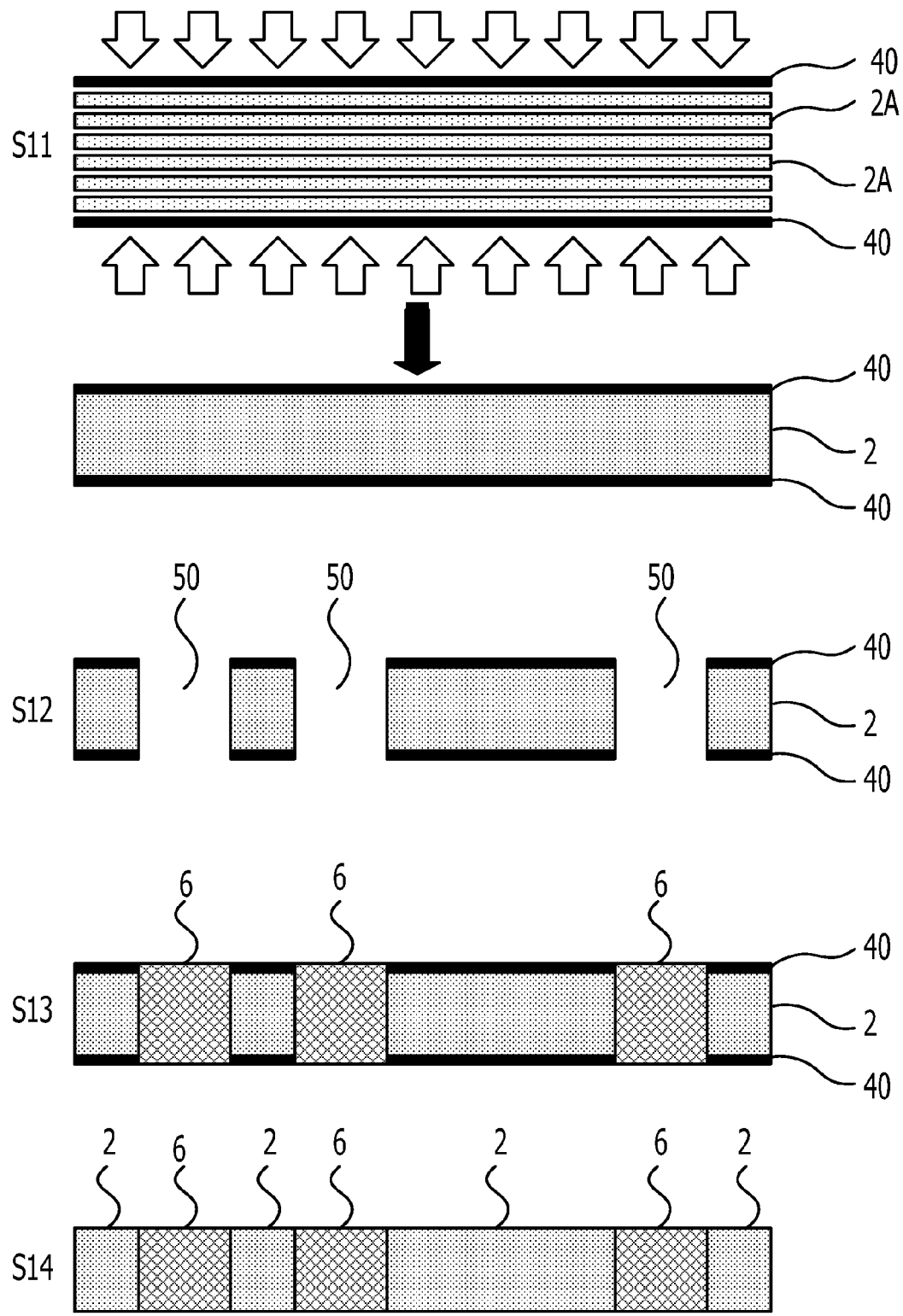
FIG. 5 illustrates a manufacturing process for the wiring substrate according to the second embodiment.
Figure 7:
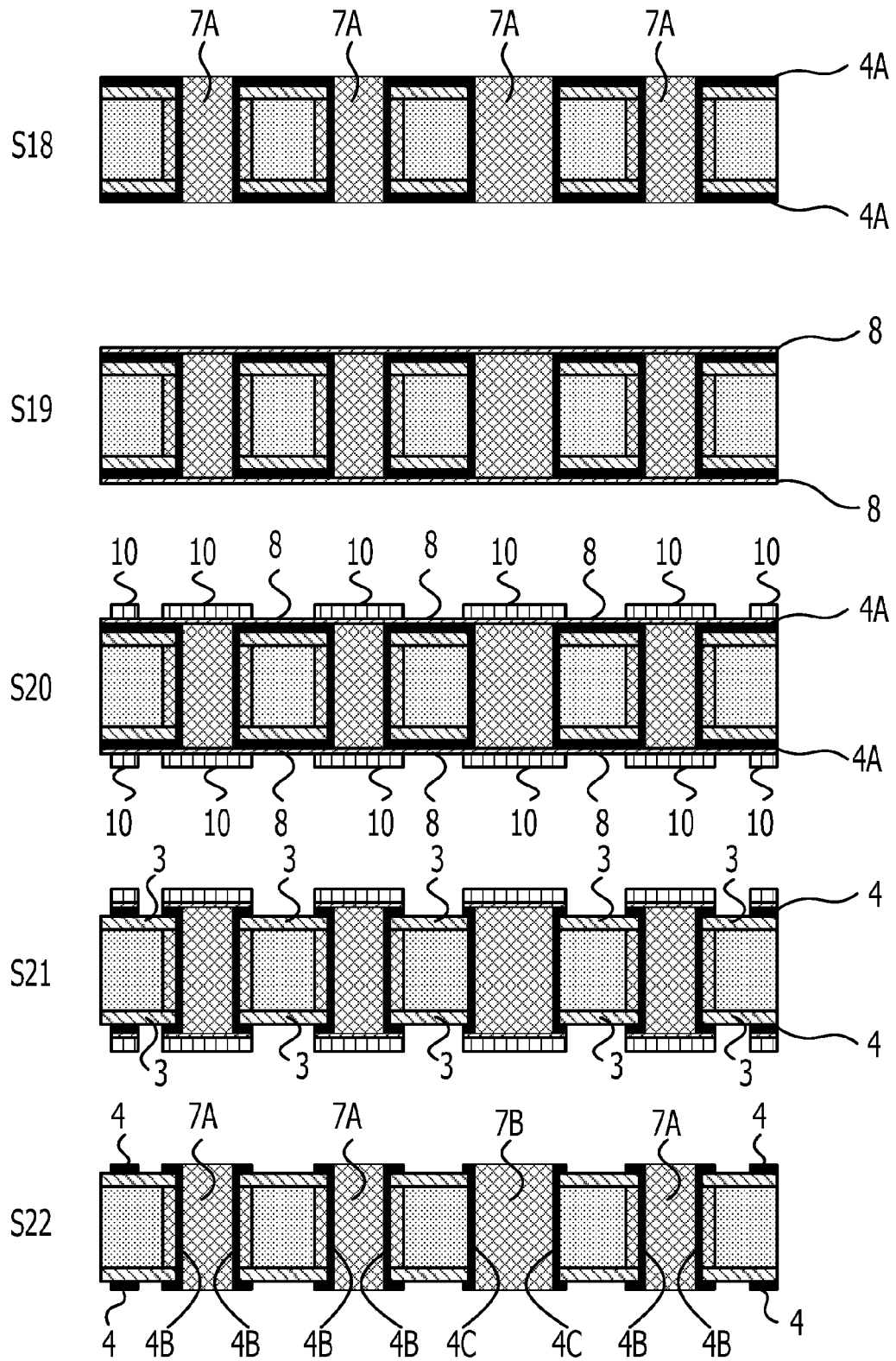
FIG. 7 illustrates the manufacturing process for the wiring substrate according to the second embodiment.

Next, a manufacturing process for the wiring substrate 1B according to the second embodiment will be described. FIGS. 5 to 7 illustrate the manufacturing process for the wiring substrate 1B according to the second embodiment.

First, with reference to FIG. 5, in a base material formation process (step S11), a plurality of prepreg materials 2A are stacked, and the stacked prepreg materials 2A and copper foils 40 are subjected to hot pressing to form a base material 2. A B-staged material obtained by impregnating a woven carbon fiber cloth with a resin may be used as the prepreg materials 2A. Fibers having a thermal expansion coefficient of about 0 ppm/° C. and an elasticity modulus of about 370 GPa, for example, may be used as the carbon fibers. If a resin for use according to FR4 is applied to the carbon fibers, a low thermal-expansion base material (CFRP (carbon fiber reinforced plastic)) having a thermal expansion coefficient of about 0 ppm/° C. and an elasticity modulus of about 80 GPa as measured after curing is obtained.

Then, in a pilot hole formation process (step S12), the base material 2 and the copper foils 40 are drilled at positions at which double-structure through hole vias 5A are to be disposed on the basis of the layout configuration to form pilot holes 50. The diameter of the pilot holes 50 may be ϕ0.8 mm, for example. Further, for the purpose of avoiding contamination of the resin with carbon powder generated during formation of the pilot holes 50, the inner peripheral wall surfaces of the pilot holes 50 may be plated with copper of 25 μm.

Then, in an insulating resin formation process (step S13), the pilot holes 50 formed in the base material 2 are filled with a hole-filling insulating resin 6. A resin mixed with a silica filler for the purpose of reducing the thermal expansion coefficient and having a thermal expansion coefficient of about 33 ppm/° C. and an elasticity modulus of 4.7 GPa, for example, may be used as the hole-filling insulating resin 6.

Then, in a substrate shaping process (step S14), the front and back sides of the base material 2 are ground to remove the insulating resin 6 having leaked from the surface of the base material 2, and to remove the copper foils 40 on the front and back sides of the base material 2. The front and back sides of the base material 2 having emerged are polished to be flattened to a predetermined thickness.

Next, with reference to FIG. 6, in a copper foil stacking process (step S15), prepreg materials 30 according to FR4 and copper foils 4A are stacked on the front and back surfaces of the base material 2 filled with the insulating resin 6, and the stacked assembly is subjected to hop pressing. In order to avoid exposure of the carbon fibers, prepreg materials containing glass fibers may be used as the prepreg materials 30. In the second embodiment, one prepreg material 30 is stacked on each surface of the base material 2 to form a 2-layer substrate with the wiring patterns 4 provided on both surfaces. In order to form a multilayer wiring substrate to be discussed later, however, double-sided copper-clad laminate boards on which a circuit is formed are sandwiched between prepreg materials 30 to be stacked to form a wiring layer 3.

Then, in a through hole formation process (step S16), the copper foils 4A, the prepreg materials 30, and the insulating resin 6 are drilled at positions at which double-structure through hole vias 5A are to be disposed on the basis of the layout configuration to form through holes 51.

Then, the copper foils 4A, the prepreg materials 30, and the base material 2 are drilled at positions at which single-structure through hole vias 5B are to be disposed on the basis of the layout configuration to form through holes 52. In this event, the through holes 52 are formed using a drill having a diameter slightly greater than the diameter of a drill used to form the through holes 51 so that the diameter of the through holes 52 is greater than the diameter of the through holes 51.

The diameter of the through holes 52 corresponds to the diameter ϕD2 of the single-structure through hole vias 5B. If the physical properties of the single-structure through hole via 5B in the planar direction (X-Y direction) are the same as the physical properties of the double-structure through hole via 5A in the planar direction, concentration of a stress on one of the through hole vias may be suppressed.

The factor that makes the double-structure through hole via 5A and the single-structure through hole via 5B different from each other in physical properties in the planar direction is that the elasticity modulus of the carbon composite material is so high compared to the elasticity modulus of the other substrate materials as to make the carbon composite material dominant in determining the physical property values of the wiring substrate 1B.

This is because pitch-based carbon fibers used in the carbon composite material have so high an elasticity modulus of 300 GPa or more that the CFRP base material obtained by adding a matrix resin to the carbon fibers also has a high elasticity modulus compared to the other wiring substrate materials (the insulating layer of the wiring substrate has an elasticity modulus of 20 to 30 GPa, and the copper wiring has an elasticity modulus of about 20 to 70 GPa).

Therefore, in order to uniformize the shape of the wiring substrate 1B including the carbon composite material, the elasticity modulus of which is dominant, the diameter ϕD2 of the single-structure through hole via 5B is set to match the diameter ϕD3 of the insulating resin 6 of the double-structure through hole via 5A. That is, if the diameter of the through holes 52 is set to be equal to the diameter of the pilot holes 50 formed in the pilot hole formation process (step S12), the physical properties of the double-structure through hole vias 5A in the planar direction and the physical properties of the single-structure through hole vias 5B in the planar direction are uniformized.

Then, in a conductive layer formation process (step S17), the inner peripheral wall surfaces of the formed through holes 51 are plated with copper having a thermal expansion coefficient of about 17 ppm/° C. to form a conductive layer 4B. The conductive layer 4B electrically connects between the copper foils 4A on the front and back sides of the base material 2. At the same time, the inner peripheral wall surfaces of the formed through holes 52 are plated with copper having a thermal expansion coefficient of about 17 ppm/° C. to form a conductive layer 4C. The conductive layer 4C electrically connects between the copper foils 4A on the front and back sides of the base material 2.

Next, with reference to FIG. 7, in a through hole filling process (step S18), the through holes 51 provided with the conductive layer 4B are filled with a resin 7A. At the same time, the through holes 52 provided with the conductive layer 4C are filled with a resin 7B. It is desirable that the resin 7A and the resin 7B be the same resin as the insulating resin 6. A resin mixed with a silica filler for the purpose of reducing the thermal expansion coefficient and having a thermal expansion coefficient of about 33 ppm/° C. and an elasticity modulus of 4.7 GPa, for example, may be used as the resin 7A and the resin 7B.

Then, in a plating process (step S19), electroless plating is performed on the surfaces of the resin 7A and the resin 7B and the copper foils 4A on the front and back sides of the wiring substrate to form electroless copper plating layers 8.

Then, in a resist formation process (step S20), dry film resists are formed on the electroless copper plating layers 8, and partially etched on the basis of the layout configuration to form resist patterns 10.

Then, in a wiring pattern formation process (step S21), the electroless copper plating layers 8 and the copper foils 4A are etched using the resist patterns 10 as masks to form wiring patterns 4 on both surfaces of the wiring substrate.

Finally, in a final treatment process (step S22), the resist patterns 10 are removed by etching. After that, the electroless copper plating layers 8 on the surfaces of the resin 7A and the resin 7B are removed.

As a result of the processes described above, the double-sided wiring substrate 1B having a thermal expansion coefficient of about 3 to 7 ppm/° C. is completed.

Figure 8:
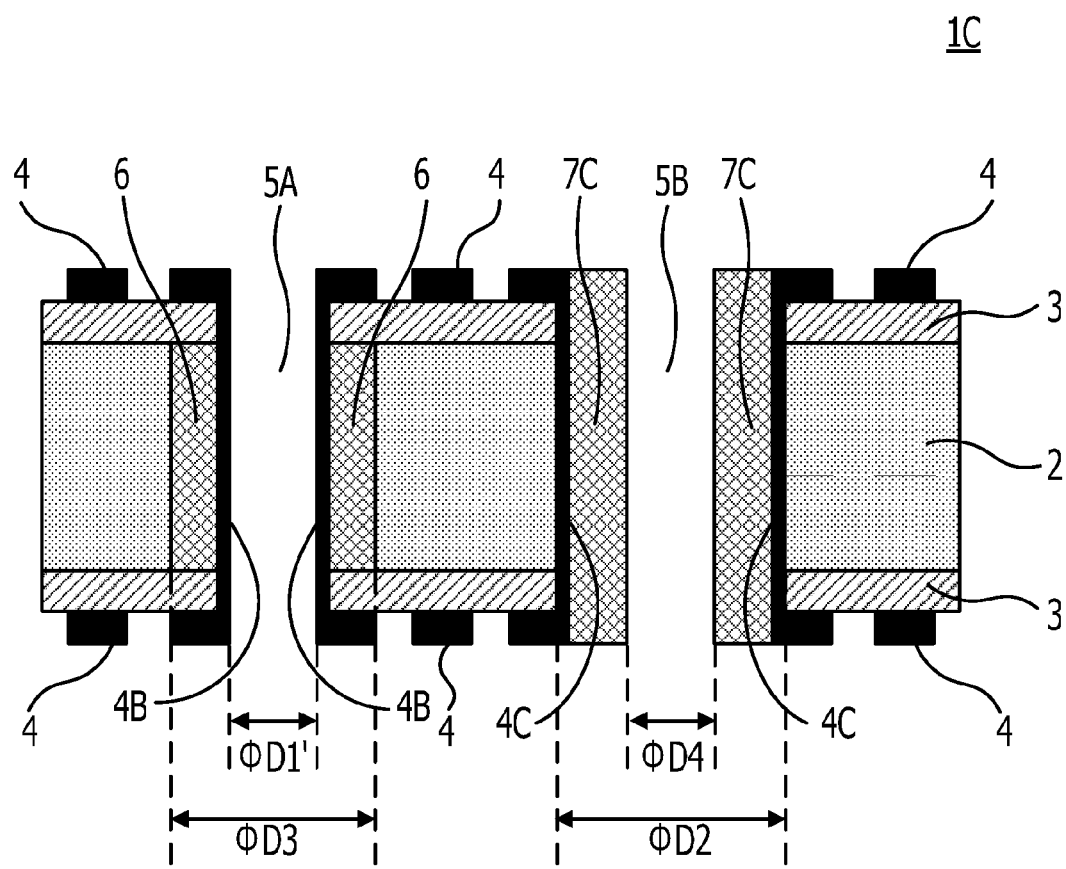
FIG. 8 is a cross-sectional view of a wiring substrate according to a third embodiment.

FIG. 8 is a cross-sectional view of a wiring substrate 1C according to a third embodiment. Components in FIG. 8 that are the same as or equivalent to those of the wiring substrate 1A according to the first embodiment illustrated in FIG. 3 are denoted by the same reference symbols, and description thereof will be omitted.

In the wiring substrate 1C according to the third embodiment, in contrast to the wiring substrate 1A according to the first embodiment, the through hole of the single-structure through hole via 5B is not completely filled with a resin, but a cylindrical resin 7C is formed along the inner wall of the through hole so that the center of the through hole remains hollow. The diameter φD4 of the hollow portion is set to be equal to the diameter φD1 of the conductive layer 4B of the double-structure through hole via 5A. The embodiment is effective in the case where the through holes may not be filled to allow connection between semiconductor devices or discreet components mounted on the front surface and the back surface of the wiring substrate through wires, for example. Also in the embodiment, in the base material 2, the cross-sectional area of the resin 7C provided in a space inside the conductive layer 4C of the single-structure through hole via 5B is equal to the cross-sectional area of the resin 6 surrounding the conductive layer 4B of the double-structure through hole via 5A. This allows the volume of resin provided in the double-structure through hole via 5A to be substantially equal to the volume of resin provided in the single-structure through hole via 5B. Therefore, concentration of a stress on one of the through hole vias, 5B, may be suppressed, avoiding occurrence of a through hole crack which is occasionally caused in the wiring substrate 100 according to the related art.

Next, the values of the physical properties in the X-Y direction of the wiring substrate according to the embodiment will be described with reference to FIGS. 9 to 11. Analytical models are set for the wiring substrate according to the related art and the wiring substrates according to the first to third embodiments, and numerical analysis is performed for the average elasticity modulus (tension) and the average thermal expansion coefficient of the wiring substrates in the X-Y direction on the basis of the physical property values of the materials and the proportions of the materials.

Figure 9:
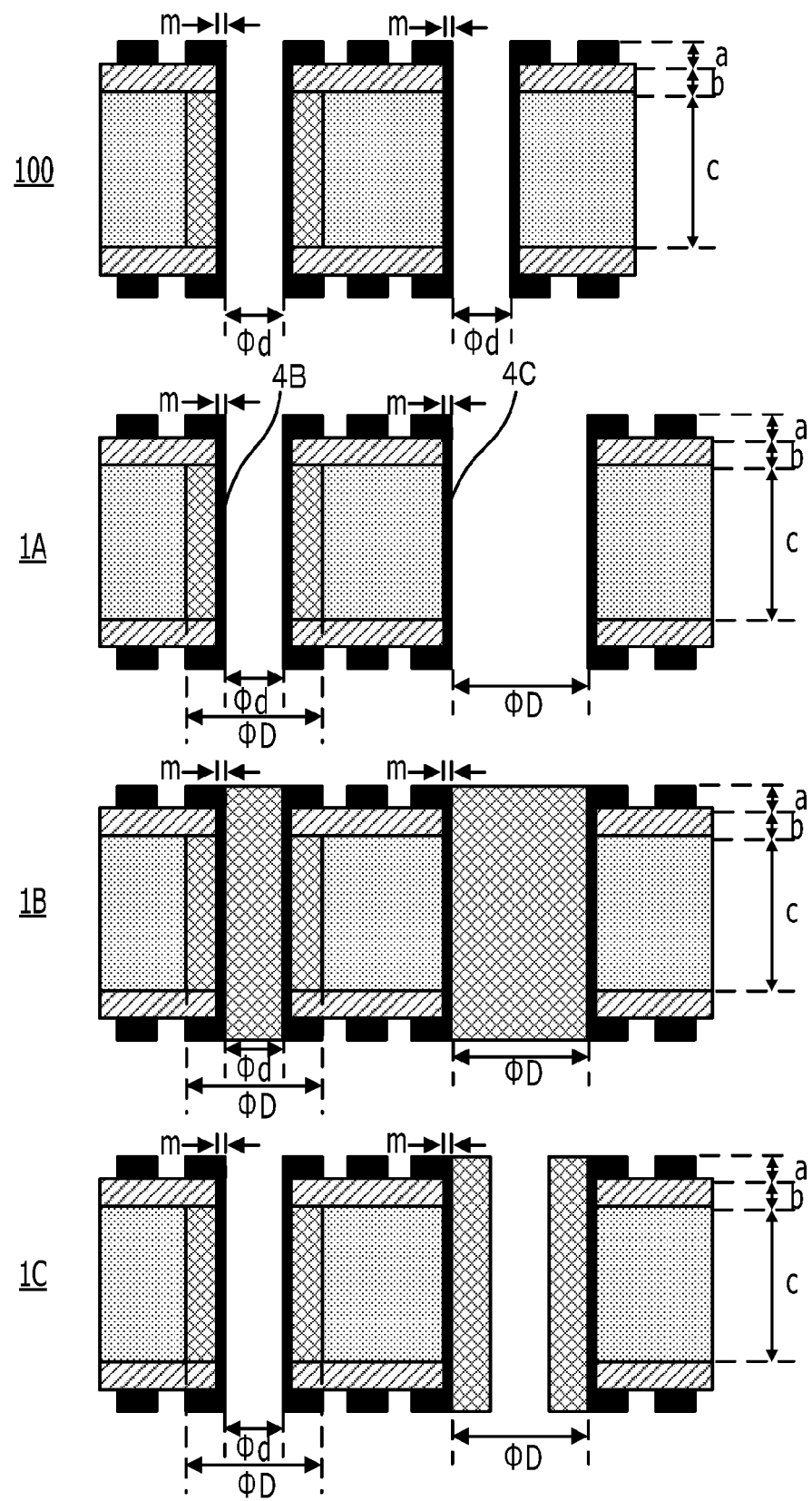
FIG. 9 illustrates analytical models for the related art and the first to third embodiments.

FIG. 9 illustrates an analytical model for the wiring substrate according to the related art in which a carbon base material is used, an analytical model for the wiring substrate 1A according to the first embodiment, an analytical model for the wiring substrate 1B according to the second embodiment, and an analytical model for the wiring substrate 1C according to the third embodiment, arranged in this order from top to bottom of the drawing. In the analytical models, for ease of analysis, the wiring layers are assumed to have solid patterns, that is, only prepregs.

FIG. 10A illustrates the physical property values of the materials for numerical analysis of the physical property values of the analytical models. As the physical property values of the materials, the physical property values of common materials are used. For the carbon composite material, the physical property values of a material obtained by impregnating a pitch-based high-elasticity material manufactured by Toray Industries, Inc., for example M40JB, with a resin in an amount of about 45 wt % (by applying the resin to the pitch-based high-elasticity material) are used. It is known that bulk copper itself has a high elasticity modulus of about 135 GPa, but plating copper has a lower elasticity modulus of 50 to 70 GPa as actually measured. Thus, an elasticity modulus of 100 GPa is used as the physical properties of the copper for the wiring and the through holes in consideration of the empirical values and for comparison among the shapes of the through holes. Likewise, the physical properties of the other materials are calculated using catalogue data of common materials used in wiring substrates. CCL-EL190 Type T manufactured by Mitsubishi Gas Chemical Company, Inc. is used as the insulating material, and THP-100DX1 manufactured by Taiyo Ink Manufacturing, Co., Ltd. is used as the hole-filling resin.

FIG. 10B illustrates the dimensions of the materials in the analytical models in FIG. 9 for numerical analysis.

FIG. 10C illustrates the results of analyzing the elasticity modulus and the thermal expansion coefficient in the X-Y direction of the double-structure through hole via and the single-structure through hole via in the analytical models in FIG. 9 based on the physical property values of the materials in FIG. 10A and the dimensions in FIG. 10B.

The analytical model for the wiring substrate 100 according to the related art has a thermal expansion coefficient of the double-structure through hole via of 4.4 ppm/° C. and a lower thermal expansion coefficient of the single-structure through hole via of 3.2 ppm/° C. As discussed earlier, the carbon composite material is prepared by pressing a matrix resin having a high thermal expansion coefficient onto carbon fibers in the thickness direction, and therefore a lower thermal expansion coefficient in the X-Y direction (planar direction) suggests an accordingly higher thermal expansion coefficient in the Z direction (substrate thickness direction). Hence, the thermal expansion coefficient of the single-structure through hole via in the Z direction is higher than the thermal expansion coefficient of the double-structure through hole via in the Z direction, and thus the conductive layer in the single-structure through hole via receives an accordingly greater stress, which makes occurrence of a through hole crack likely.

The analytical model for the wiring substrate 1A according to the first embodiment has a thermal expansion coefficient of the single-structure through hole via of 3.5 ppm/° C., which is slightly higher than that of the analytical model for the wiring substrate 100 according to the related art, 3.2 ppm/° C. Therefore, it is found that the analytical model for the wiring substrate 1A has a slightly lower thermal expansion coefficient of the single-structure through hole via in the Z direction, and thus the conductive layer in the single-structure through hole via receives a smaller stress.

The analytical model for the wiring substrate 1B according to the second embodiment has a thermal expansion coefficient of the single-structure through hole via of 5.3 ppm/° C., which is close to the thermal expansion coefficient of the double-structure through hole via of 5.1 ppm/° C. Hence, the thermal expansion coefficient of the single-structure through hole via in the Z direction is also substantially equal to the thermal expansion coefficient of the double-structure through hole via in the Z direction. Thus, it is found that a stress does not concentrate on one of the through hole vias, which makes occurrence of a through hole crack less likely.

The analytical model for the wiring substrate 1C according to the third embodiment has a thermal expansion coefficient of the single-structure through hole via of 4.6 ppm/° C., which is close to the thermal expansion coefficient of the double-structure through hole via of 4.4 ppm/° C. Hence, the thermal expansion coefficient of the single-structure through hole via in the Z direction is also substantially equal to the thermal expansion coefficient of the double-structure through hole via in the Z direction. Thus, also in this case, a stress does not concentrate on one of the through hole vias, which makes occurrence of a through hole crack less likely.

In the first to third embodiments, double-sided wiring substrates are described. However, the present technology may also be applied to multilayer wiring substrates and build-up wiring substrates.

Figure 11:
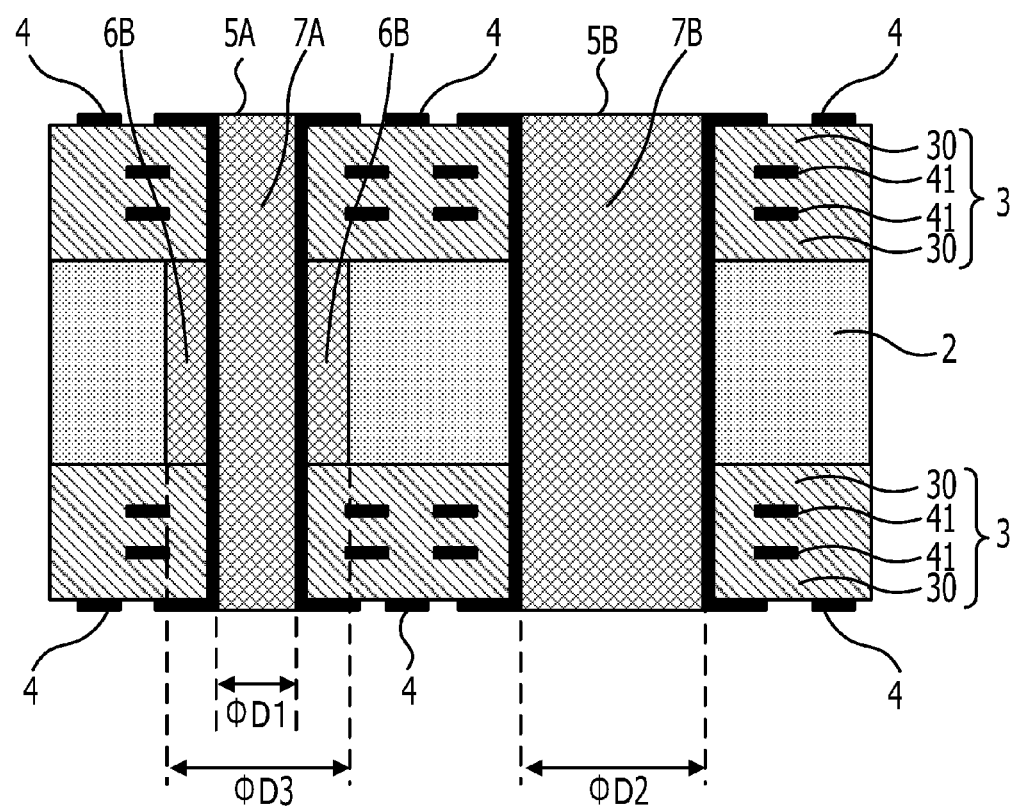
FIG. 11 is a cross-sectional view of a 6-layer wiring substrate according to a fourth embodiment.

FIG. 11 is a cross-sectional view of a 6-layer wiring substrate 1D according to a fourth embodiment. Components in FIG. 11 that are the same as or equivalent to those of the wiring substrate 1B illustrated in FIG. 4 are denoted by the same reference symbols, and description thereof will be omitted.

The 6-layer wiring substrate 1D illustrated in FIG. 11 is formed as follows. In the copper foil stacking process (step S15) of the manufacturing process for the wiring substrate 1B according to the second embodiment discussed earlier, two double-sided copper-clad laminate boards 41 on which a circuit is formed are sandwiched between three prepreg materials 30, and the resulting assembly is stacked on each side of the base material 2 filled with the insulating resin 6 to form 2-layer wiring layers 3. A copper foil 4A is stacked on each wiring layer 3, and the stacked assembly is subjected to hot pressing to obtain a wiring structure having three layers for each side and six layers for both sides.

Also in the multilayer wiring substrate 1D, the diameter of the single-structure through hole via 5B is greater than the diameter of the double-structure through hole via 5A, and both the through hole vias are filled with a resin. Thus, a stress does not concentrate on one of the through hole vias, avoiding occurrence of a through hole crack.

Figure 12:
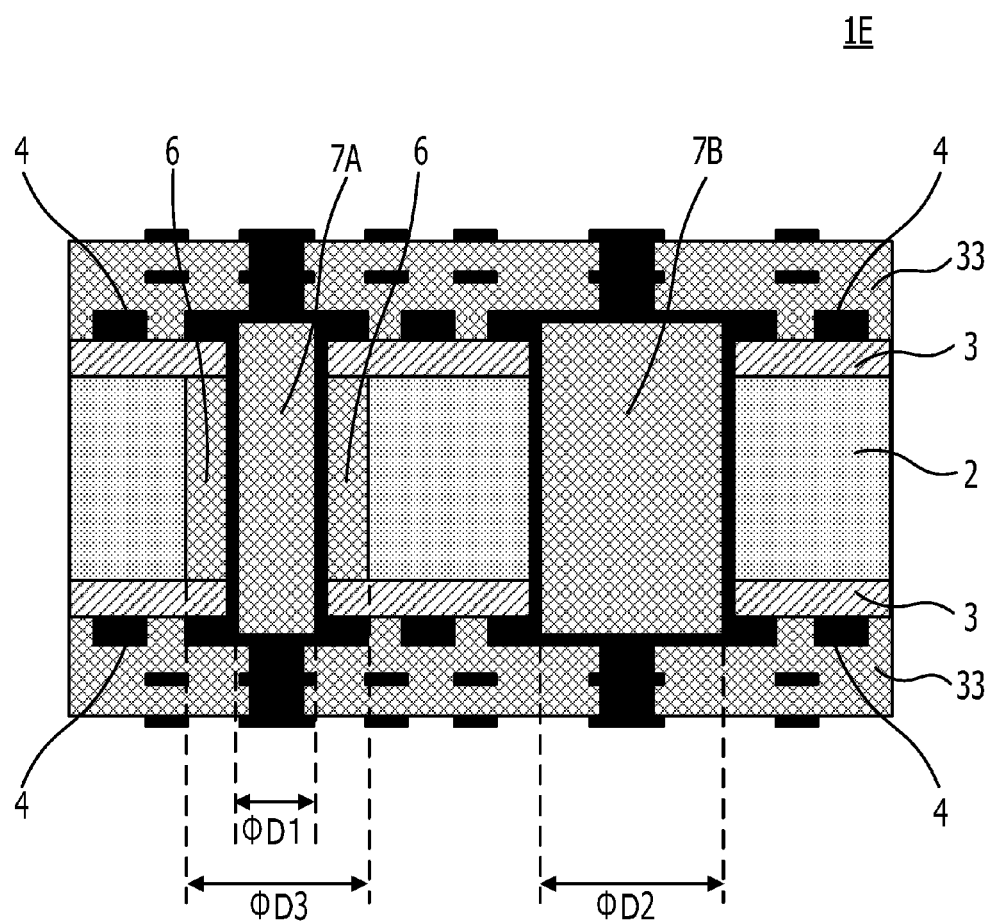
FIG. 12 is a cross-sectional view of a build-up wiring substrate according to a fifth embodiment.

FIG. 12 is a cross-sectional view of a build-up wiring substrate 1E according to a fifth embodiment. Components in FIG. 12 that are the same as or equivalent to those of the wiring substrate 1B illustrated in FIG. 4 are denoted by the same reference symbols, and description thereof will be omitted. The build-up wiring substrate 1E illustrated in FIG. 12 is formed by forming the double-sided wiring substrate 1B according to the second embodiment and thereafter stacking build-up wiring layers 33 on the wiring substrate 1B.

The elasticity modulus of the materials other than the carbon composite material are smaller than the elasticity modulus of the carbon composite material, and copper plating itself for copper wiring and through holes, which has a high elasticity modulus among the materials forming the wiring substrate, has a small thickness of about several tens of microns, and thus occupies a small proportion of the entire volume. Therefore, such materials do not significantly affect the physical properties. Hence, the physical properties of the build-up wiring substrate 1E according to the embodiment, which is formed just by stacking the build-up wiring layers 33 on the double-sided wiring substrate 1B according to the second embodiment, depend on the physical properties of the double-sided wiring substrate 1B according to the second embodiment.

FIG. 13A is a cross-sectional view of a wiring substrate 1F according to a sixth embodiment. FIG. 13B is a cross-sectional view of a wiring substrate 1G according to a seventh embodiment. FIG. 13C illustrates the physical property values of analytical models for the wiring substrates 1F and 1G. Components in FIG. 13 that are the same as or equivalent to those of the wiring substrate 1A according to the first embodiment illustrated in FIG. 3 are denoted by the same reference symbols, and description thereof will be omitted.

In the wiring substrate 1F according to the sixth embodiment illustrated in FIG. 13A, in contrast to the wiring substrate 1A according to the first embodiment, a conductive layer 4E is formed at the boundary between the insulating resin 6 of the double-structure through hole via 5A and the base material 2, and a conductive layer 4D is formed at the boundary between the base material 2 and the wiring layer 3.

The conductive layer 4E and the conductive layer 4D are formed as follows. In the pilot hole formation process (step S12) of the manufacturing process for the wiring substrate 1B according to the second embodiment discussed earlier, pilot holes 50 are formed in the base material 2 by drilling, and thereafter the inner walls of the pilot holes 50 and the surfaces of the base material 2 are plated with copper. The copper plating is provided for the purpose of avoiding contamination of the hole-filling resin with carbon powder generated when the pilot holes 50 are formed in the base material 2, which is a carbon composite material, by drilling.

In the wiring substrate 1G according to the seventh embodiment illustrated in FIG. 13B, in contrast to the wiring substrate 1F according to the sixth embodiment, the through holes of the through hole vias are filled with a resin. The total amount of resin provided in the double-structure through hole via 5A is substantially the same as the amount of resin provided in the single-structure through hole via 5B.

FIG. 13C illustrates the results of analyzing the elasticity modulus and the thermal expansion coefficient of the double-structure through hole via and the single-structure through hole via in the X-Y direction using analytical models for the wiring substrate 1F and the wiring substrate 1G.

The thickness e of the conductive layer 4D is defined as 0.0025 mm, and the thickness n of the conductive layer 4E is defined as 0.025 mm. For the other dimensions, the values of the analytical models in FIG. 10B are used.

The analytical model for the wiring substrate 1G according to the seventh embodiment has a thermal expansion coefficient of the single-structure through hole via in the X-Y direction of 5.9 ppm/° C., which is close to the thermal expansion coefficient of the double-structure through hole via of 6.1 ppm/° C. Hence, the thermal expansion coefficient of the single-structure through hole via in the Z direction is also substantially equal to the thermal expansion coefficient of the double-structure through hole via in the Z direction. Thus, also in this case, it is found that a stress does not concentrate on one of the through hole vias, which makes occurrence of a through hole crack less likely.

Figure 14A:
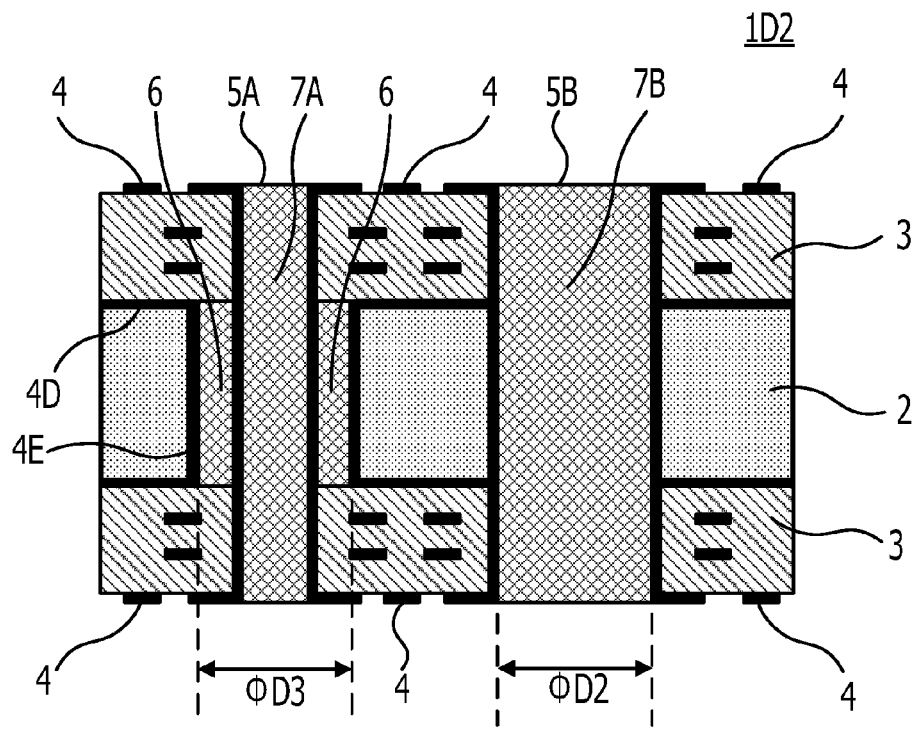
FIG. 14A is a cross-sectional view of a wiring substrate according to a modification of the fourth embodiment.

FIG. 14A is a cross-sectional view of a 6-layer wiring substrate 1D2 in which, in contrast to the 6-layer wiring substrate 1D according to the fourth embodiment illustrated in FIG. 11, a conductive layer 4E is formed at the boundary between the insulating resin 6 of the double-structure through hole via 5A and the base material 2, and a conductive layer 4D is formed at the boundary between the base material 2 and the wiring layer 3.

Figure 14B:
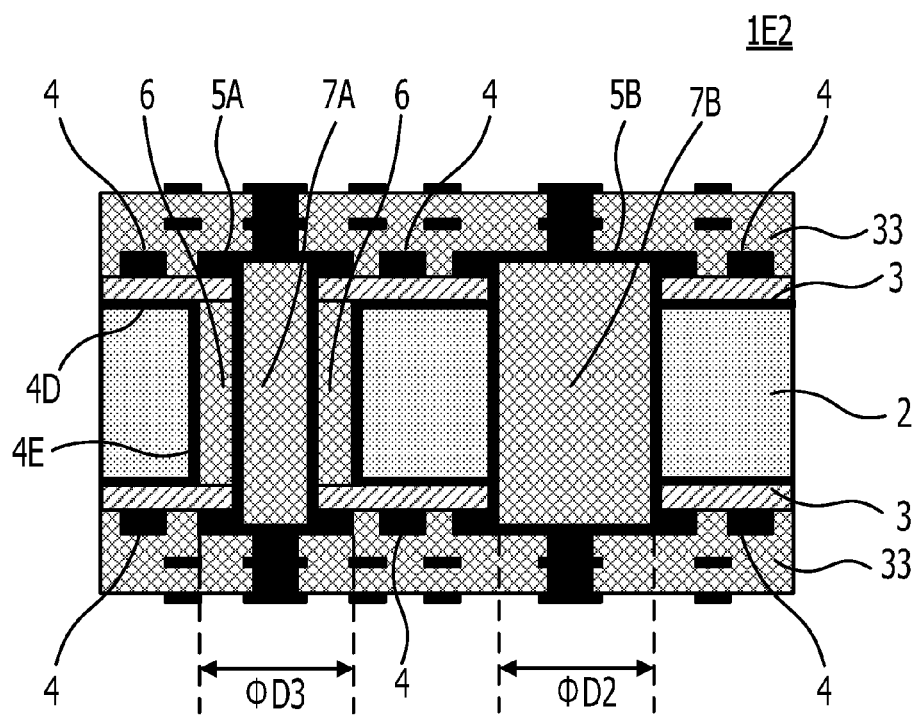
FIG. 14B is a cross-sectional view of a wiring substrate according to a modification of the fifth embodiment.

FIG. 14B is a cross-sectional view of a build-up wiring substrate 1E2 in which, in contrast to the build-up wiring substrate 1E according to the fifth embodiment illustrated in FIG. 12, a conductive layer 4E is formed at the boundary between the insulating resin 6 of the double-structure through hole via 5A and the base material 2, and a conductive layer 4D is formed at the boundary between the base material 2 and the wiring layer 3.

In both the 6-layer wiring substrate 1D2 and the build-up wiring substrate 1E2, the diameter $\phi$D2 of the conductive layer 4C of the single-structure through hole via 5B is determined to be equal to the diameter $\phi$D3 of the insulating resin 6 surrounding the double-structure through hole via 5A. In the base material 2, the total of the cross-sectional area of a resin 7A provided in a space inside the conductive layer 4B of the double-structure through hole via 5A and the cross-sectional area of the resin 6 surrounding the conductive layer 4B is set to be equal to the cross-sectional area of a resin 7B provided in a space inside the conductive layer 4C of the single-structure through hole via 5B.

As discussed earlier, the elasticity modulus of the materials other than the carbon composite material are smaller than the elasticity modulus of the carbon composite material, and copper plating itself for copper wiring and through holes, which has a high elasticity modulus among the materials forming the wiring substrate, has a small thickness of about several tens of microns, and thus occupies a small proportion of the entire volume. Therefore, such materials do not significantly affect the physical properties. Hence, the presence of the conductive layers 4 on the surfaces of the base material 2 does not significantly affect the physical properties. Thus, the 6-layer wiring substrate 1D2 has physical properties equivalent to those of the 6-layer wiring substrate 1D, and the build-up wiring substrate 1E2 has physical properties equivalent to those of the build-up wiring substrate 1E. Hence, concentration of a stress on one of the through hole vias is suppressed, avoiding occurrence of a through hole crack.

In the embodiments described above, the thermal expansion coefficients, the elasticity modulus, the dimensions, etc. of the materials forming the wiring substrates are described using specific values. However, such values are merely illustrative of the present technology, and are not construed as limiting the technical concept of the present technology.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring substrate comprising:
a plate-like base material containing carbon fibers;
a wiring layer formed on a surface of the base material;
a first via including a first through hole penetrating through the base material, a first resin layer formed on an inner wall of the first through hole and including a second through hole, and a first conductive layer formed on an inner wall of the second through hole; and
a second via including a third through hole penetrating through the base material and a second conductive layer formed on an inner wall of the third through hole,
wherein an inside diameter of the third through hole is greater than an inside diameter of the second through hole,
wherein spaces inside the first conductive layer and the second conductive layer are filled with a resin, and
wherein the inside diameter of the third through hole is equal to an inside diameter of the first through hole.

2. The wiring substrate according to claim 1, wherein the resin filling the spaces inside the first conductive layer and the second conductive layer has the same thermal expansion coefficient and the same elasticity modulus as those of the first resin layer.

3. A wiring substrate comprising:
a plate-like base material containing carbon fibers;
a wiring layer formed on a surface of the base material;
a first via including a first through hole penetrating through the base material, a first resin layer formed on an inner wall of the first through hole and including a second through hole, and a first conductive layer formed on an inner wall of the second through hole; and
a second via including a third through hole penetrating through the base material and a second conductive layer formed on an inner wall of the third through hole,
wherein an inside diameter of the third through hole is greater than an inside diameter of the second through hole,
wherein a second resin layer including a fourth through hole is formed on an inner wall of the second conductive layer, and an inside diameter of the fourth through hole is equal to the inside diameter of the second through hole.

4. The wiring substrate according to claim 3, wherein the second resin layer has the same thermal expansion coefficient and the same elasticity modulus as those of the first resin layer.

5. A manufacturing method for a wiring substrate, comprising:
forming a first through hole having a first diameter in a carbon composite substrate;
filling the first through hole with a first resin;
forming a first conductive layer on upper and lower surfaces of the carbon composite substrate;
forming a second through hole having a second diameter less than the first diameter at a position of the carbon composite substrate filled with the first resin;
forming a third through hole having a diameter greater than the second diameter at a position of the carbon composite substrate not filled with the first resin;
forming a second conductive layer on an inner wall of the second and third through holes; and
partially removing the first conductive layer to form a wiring layer on the upper and lower surfaces of the carbon composite substrate,
wherein the forming the third through hole includes forming the third through hole, a diameter of which is greater than a diameter of the second through hole and equal to a diameter of the first through hole, and
the forming the second conductive layer is followed by filling a space inside the second conductive layer with a second resin.

* * * * *